United States Patent [19]
Kim et al.

[11] Patent Number: 5,933,022
[45] Date of Patent: Aug. 3, 1999

[54] INPUT PAD HAVING AN ENABLE TERMINAL EMPLOYED IN A LOW-CURRENT-CONSUMING INTEGRATED CIRCUIT

[75] Inventors: Jun-gu Kim; Heung-jig Lee, both of Seoul, Rep. of Korea

[73] Assignee: Samsung Electronics Co., Ltd, Kyungki-do, Rep. of Korea

[21] Appl. No.: 08/948,646

[22] Filed: Oct. 10, 1997

[30] Foreign Application Priority Data

Oct. 11, 1996 [KR] Rep. of Korea .................. 96-45314

[51] Int. Cl.⁶ ............... H03K 17/51; H03K 19/0175; H03K 19/20; H03K 19/21
[52] U.S. Cl. ............................. 326/38; 326/47
[58] Field of Search ................ 326/38, 47; 327/142, 327/143, 544

[56] References Cited

U.S. PATENT DOCUMENTS 5,504,875  4/1996  Mills et al. ............... 395/497.02

FOREIGN PATENT DOCUMENTS 403209853  9/1991  Japan ............................. 326/47

*Primary Examiner*—David Mis
*Attorney, Agent, or Firm*—Sughrue, Mion, Zinn, Macpeak & Seas, PLLC

[57] ABSTRACT

An input pad (4) is adapted to include a input signal terminal for receiving input signal (A), an enable terminal for receiving power-down signal (P-), and a logic gate (such as a NOR Boolean arithmetic unit) to perform logical arithmetic upon receiving the input signal (A) and the power-down signal (P-) from the input terminal and the enable terminal, respectively. Such input pad (A) is employed in a low-current consuming integrated circuit having a limited number of input pads for increasing the number of available input pads for receiving input signal thus increasing the process speed.

9 Claims, 2 Drawing Sheets

INPUT PAD HAVING AN ENABLE TERMINAL EMPLOYED IN A LOW-CURRENT-CONSUMING INTEGRATED CIRCUIT

BACKGROUND OF THE INVENTION

1. Field of the Invention

The present invention relates to a low-current-consuming integrated circuit (IC) incorporating an input pad which has an enable terminal. More particularly, it relates to an IC which incorporates an input pad which includes an enable terminal and an input terminal, thereby simultaneously receiving an enable signal and an input signal, to minimize current consumption.

2. Description of the Related Art

A typical IC has a function module which includes a typical IC also includes an input pad for transmitting the incoming signal to the function module, and an output pad for outputting each signal processed from the function module.

In order for an input pad to transmit an incoming signal to a respective function module, the input pad must have an input terminal electrically connected to one of the leads of the component and an output terminal electrically connected to the function module. A number of such input pads are included in the IC, and each of the input pads may be directly or indirectly connected to a respective lead.

Furthermore, a typical IC includes an enable capability. In order to execute such capability, one input pad is used as an enable terminal such that the function module is able to directly receive an exterior enable signal.

However, in order to incorporate the enable capability, the conventional IC must dedicate at least one of the input pads to connect its input terminal as an enable terminal. Consequently, the number of the input pads for receiving input signal decreases such that not only is the number of available input pads limited but also the processing speed slows down.

SUMMARY OF THE INVENTION

It is therefore an object of the present invention to provide an input pad able to incorporate both a signal input terminal and an enable terminal for simultaneously receiving a signal input and an enable input.

It is another object of the present invention to provide a low-current-consuming IC by conducting a power-down mode using such input pad, which incorporates both a signal input terminal and an enable terminal, to convert the input signal being inputted to a function module to a static form while in a power-down mode to minimize current consumption of the function module.

In order to accomplish these objects, an IC input pad according to a first preferred embodiment of the present invention has a signal input terminal for receiving an input signal, an enable terminal for receiving a power-down signal, and an enabling system which includes a logic arithmetic unit for performing logic arithmetic (or, Boolean arithmetic) after simultaneously receiving the input signal and the power-down signal from the signal input terminal and the enable terminal, respectively.

Preferably, in a power-down mode, the power-down signal may be provided as a logic "High" state. The logic arithmetic unit includes an inverter to invert a NOR gate which performs the logic arithmetic after simultaneously receiving the input signal and the power-down signal or an output from the NOR gate.

Alternatively, in a power-down mode, the power-down signal may also be preferably provided as a logic "Low" state. The logic arithmetic unit includes an inverter to invert a NAND gate which performs the logic arithmetic after simultaneously receiving the input signal and the power-down signal or an output from the NAND gate.

According to a second preferred embodiment, the dynamic input signal is converted to a static state in the power-down mode before being outputted from the input pad. In this embodiment the IC includes: an input terminal for receiving an input signal which is inputted as a dynamic clock having a certain cycle; an enable terminal for receiving a power-down signal having a predetermined level in the power-down mode; an input pad incorporating a logic arithmetic unit for performing the logic arithmetic after simultaneously receiving the input signal and the power-down signal from the signal input terminal and the enable terminal, respectively; and an output enable terminal from the input pad which provides the performed result of the logic arithmetic function unit to a corresponding function module.

In this second preferred embodiment, as with the first, the power-down signal in a power-down mode may be preferably provided as a logic "High" state, and the logic arithmetic -unit includes an inverter to invert a NOR gate which performs the logic arithmetic. Also, as with the first preferred embodiment, the power-down signal in a power-down mode according to the second preferred embodiment may be preferably provided as a logic "Low" state, and the logic arithmetic unit includes an inverter to invert a NAND gate which performs the logic arithmetic.

BRIEF DESCRIPTION OF THE DRAWINGS

A more complete appreciation of this invention, and many of the attendant advantages thereof, will be readily apparent as the invention becomes better understood by reference to the following detailed description when considered in conjunction with the accompanying drawings, in which like reference symbols indicate the same or similar components, wherein.

DETAILED DESCRIPTION OF THE PREFERRED EMBODIMENTS

The preferred embodiments hereinafter will be described in more specific detail by referring to the diagrams.

Figure 1A:
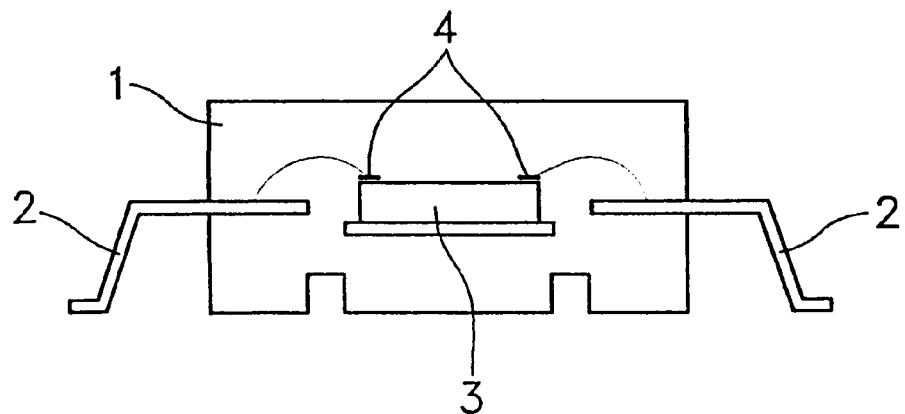
FIG. 1A is a fragmentary sectional view showing an inside structure of a typical integrated circuit (IC)
Figure 1B:
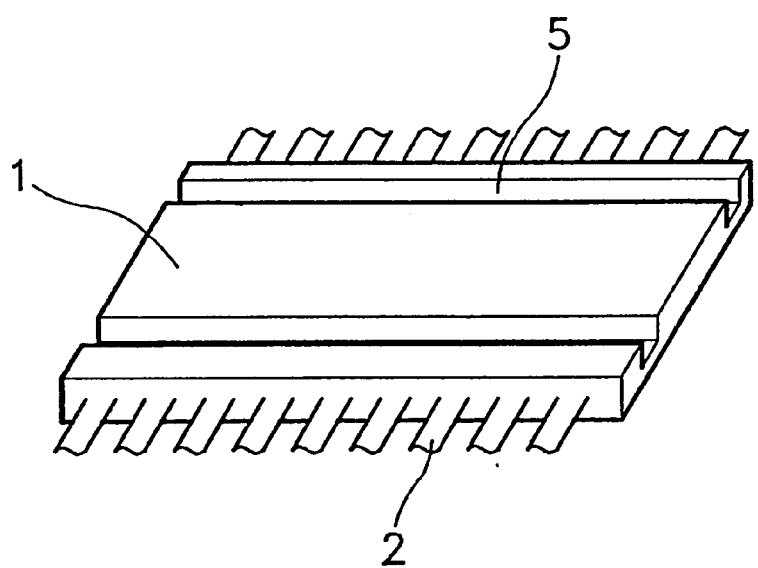
FIG. 1B is a schematic view of a typical IC.

FIG. 1A is a fragmentary sectional view showing an inside structure of a typical IC, and FIG. 1B is a schematic view of such IC.

According to the diagram, the typical IC includes a main body 1 and a number of leads 2 which are projected outwardly from the body. Moreover, a chip is located inside the main body 1, and such chip contains a function module 3 divided into a number of sections for executing a corresponding function of the IC and a number of input/output pads 4 for transmitting data between the function modules and exterior parts. Each of the leads 2 is connected to a corresponding input/output pad 4 by means of a wire. Each of input/output pads 4 is connected to each corresponding function modules 3 on the chip.

In order to incorporate an enable capability to an IC having such structure, at least one of the input pads 4 is conventionally designated as an enable terminal. Consequently, since at least one of the limited number of the input/output pads 4 of the IC must be designated as the enable terminal, the number of available input pads for receiving incoming signals decreases such that the processing speed decreases as well.

Furthermore, for executing the enable capability, the function module 3 receives the input signal received from a input pad and the enable signal received from an enable terminal simultaneously to execute the corresponding function based on the signal received. Such typical input signal is a dynamic clock signal divided by a main clock. Such the clock signal contains repeated logic "High" and logic "Low" cycles. When the function module 3 operates based on such input signal, the corresponding function module 3 consumes 3.23 mA (in case a driving voltage of 3.3 V is provided to a PDA-only interface IC). Since the function module 3 continues to consume such amount of current even if the corresponding component is non-functioning, a large amount of wasted current is consumed.

In order to overcome such problem, a power-down mode is incorporated in an IC. Such power-down mode prevents an input signal to be inputted to the function module 3 and forcefully provides a constant supplemental signal based on an enable signal condition set up by a user. Such a low-current consuming IC, which permits the function module to suspend operation, is illustrated in FIG. 2.

Figure 2:
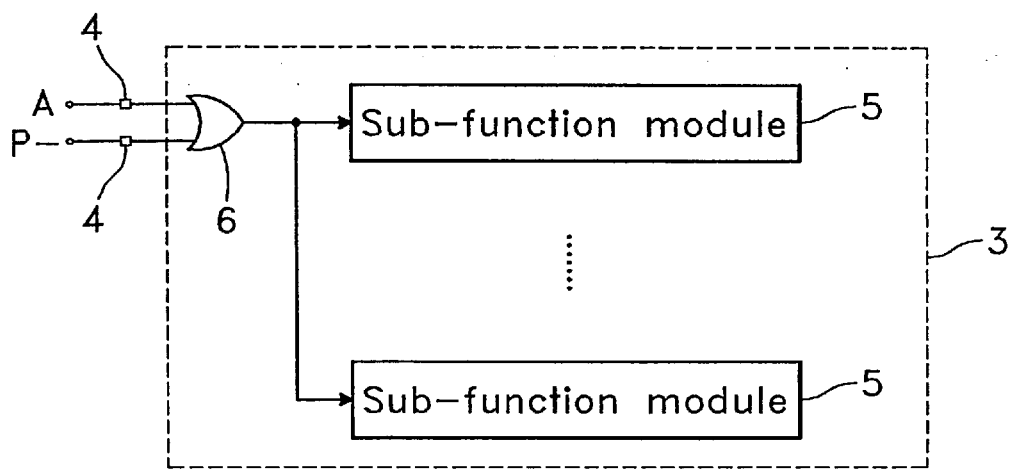
FIG. 2 is a block diagram of a conventional low-current-consuming IC.

According to FIG. 2, the function module 3 includes an OR gate 6 for performing the logic arithmetic on both the inputted input signal A, which is for controlling an operational state of the function module 3, and the inputted power-down signal P−, which is for indicating an initiation of power-down mode. After performing the logic arithmetic, the OR gate 6 outputs the result to the corresponding sub-function modules 5 of the function module 3. The necessary number of such sub-function modules 5 is determined according to the capacity and the size of the function module 3.

Specifically, for the low-current consuming IC having such structure during a normal operating mode, since the power-down signal P− is in a logic "Low" state, the input signal A and the output signal from the OR gate 6 both have the same value. In this case, operations of the sub-function modules 5 designated in the function module 3 are controlled based on the input signal A.

On the other hand, when the power-down mode is initiated by satisfying a predetermined condition, the power-down signal is in a logic "High" state. In this case, the output value of the OR gate 6 has a constant value (logic "High" value) independent from the input signal A. As a result, since a constant value (logic "High") is provided to the sub-function modules 5, the function module 3 does not operate.

For example, in case of a cellular phone, when a user is pressing a certain key for receiving a call, the controller (not shown) sends a power-down signal of the logic "Low" state. Moreover, the corresponding clock signal of the key pressed by the user or the call received is inputted to the OR gate 6 as the input signal A. As a result, the sub-function modules 5 may operate according to the clock signal of the input signal A.

On the other hand, when the cellular phone has been inactive for a predetermined time (e.g. no key pressed or no calls received), the controller sends a power-down signal P− having the logic "High" state such that the output of the OR gate 6 maintains the logic "High" state independent from the input signal A. As a result, the sub-function module 5 receives a signal having a constant value so that the function module 3 does not operate.

When the cellular phone has been inactive for a predetermined time, all the functions of the phone, except for the absolutely essential functions, are assigned the power-down mode. As a result, only the absolutely essential functions of the phone operate. Therefore, unnecessary current consumption can be prevented. Specifically, by providing the power-down signal P− to control the operation of the function module 3, the current consumption of the function module 3 can be reduced by 80 $\mu$A.

However, such a conventional low-current consuming IC must incorporate the OR gate 6, which performs the logic arithmetic of the input signal A and the power-down signal P− to execute the power-down mode, inside the function module 3. Therefore, the reduction of the consumption of the current is not fully realized due to the dynamic characteristic of the input signal. Furthermore, since at least one of the input pads must be assigned solely as an enable terminal, the number of available input pads for receiving input signals are reduced so that the problems of accepting the limited number of input signals and the limited transmission speed still exists.

Figure 3:
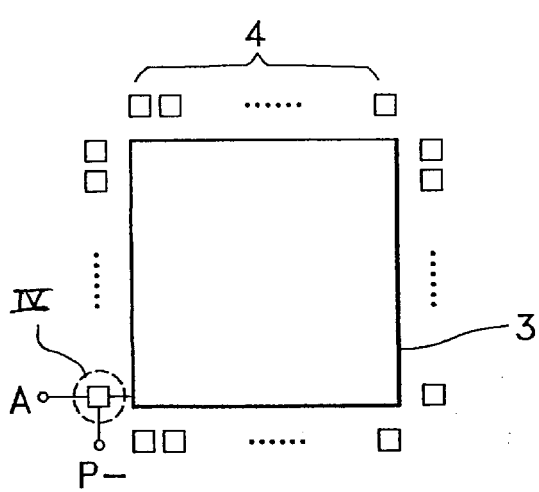
FIG. 3 is a block diagram of an input pad having an enable terminal according to the present invention.
Figure 4:
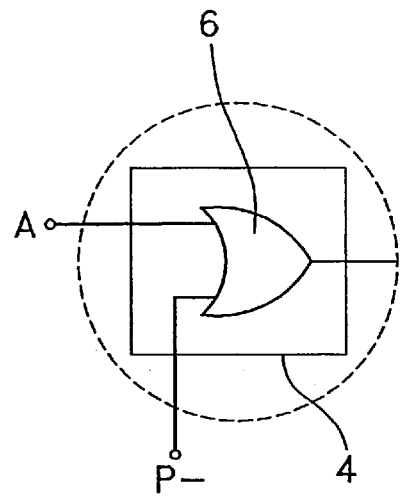
FIG. 4 is a detail diagram of an input pad of FIG. 3.

FIG. 3 is a block diagram showing an input pad according to the present invention, in relation to other pads and a function module. FIG. 4 is a detail view of FIG. 3 which shows the inside structure of an input pad having an enable terminal according to the present invention.

As shown in FIG. 3, the low-current consuming IC of the present invention includes a function module 3 for executing the corresponding function of the IC. The low-current consuming IC of the present invention also includes a number of input pads 4 (see FIG. 4) having a signal input terminal and an enable terminal for receiving an input signal A and a power-down signal P− simultaneously and an OR gate 6 for performing the logic arithmetic.

The following describes the operations of the inventive IC in more specific detail.

For the low-current consuming IC of the present invention during a normal operating mode, since the power-down signal P− is in a logic "Low" state, the input signal A and the output signal from the OR gate 6 both have the same value. In this case, the function module 3 operates according to the input signal A.

On the other hand, when the power-down mode is initiated by satisfying a predetermined condition, the power-down signal is in a logic "High" state. In this case, the output value of the OR gate 6 has a constant value (logic "High" value) independent from the input signal A. As a result, since the constant value (logic "High") is provided to the function module 3, the function module 3 does not operate.

For example, again, in the case of a cellular phone, when a user presses a certain key or receives a call, the controller (not shown) sends a power-down signal of the logic "Low" state. Moreover, the corresponding clock signal of the key pressed by the user or the call received is inputted to the OR gate 6 as the input signal A. As a result, the sub-function modules 5 may operate according to the clock signal of the input signal A.

On the other hand, when the cellular phone has been inactive for a predetermined time (e.g. no key has been pressed or no call has been received), the controller sends a power-down signal P− having the logic "High" state such that the output of OR gate 6 maintains the logic "High" state independent from the input signal A. As a result, the function module 3 receives a signal having a constant value so that the function module 3 does not operate.

The signal received by the input pad 4 is in a dynamic clock form having a predetermined frequency. However, during the power-down mode, the input pads 4 output a constant static form of the logic "High" signal. The switching operation of the function module 3 occurs when the received clock signal changes from the logic "High" state to the logic "low" state or vice versa. During such switching process, current consumption tends to increase. However, since the output signal from the input pads 4 is in the static form, the switching does not occur in the function module 3. Consequently, the current consumption of the function module 3 is reduced to less than 1 $\mu$A (in the case a driving voltage of 3.3 V is provided to a PDA-only interface IC). In other words, since the controlling of the power-down mode based on power-down signal P– is achieved in the input pads 4, the current consumption of the function module 3 is minimized.

Furthermore, since the input pads 4 of the present invention can incorporate both the input terminal and the enable terminal simultaneously, there is no need to assign any input pad 4 separately for enabling the function module 3. As a result, the numbers of the input signal provided to the IC can be increased thus increasing the processing speed.

The above preferred embodiment has been described using the OR gate 6 as a means for performing the logic arithmetics. However, any other form of arithmetic unit (or, logic gate) can be used to satisfy the need of the present invention.

In sum, according to the present invention, the number of available input terminals can be increased by simultaneously incorporating a signal input terminal and an enable terminal to an input pad of a low-current consuming IC. Therefore, the processing speed may increase. Moreover, by incorporating such input pad to execute a power-down mode, the signal sent to the function module during the power-down mode is converted to a static form. Consequently, current consumption of the function module is minimized.

While the present invention has been described in connection with preferred embodiments, it should be apparent to others skilled the art that various modifications and equivalent arrangements can be made without departing from the spirit and scope of the invention.

What is claimed is:

1. An input pad for use with an integrated circuit, the input pad comprising:
    a signal input terminal for receiving an input signal;
    an enable terminal for receiving a power-down signal; and
    a logic arithmetic unit for performing logic arithmetic after simultaneously receiving said input signal from said signal input terminal and said power-down signal from said enable terminal.

2. The input pad of claim 1 characterized in that during a power-down mode, said power-down signal is outputted in a logic "High" state wherein said logic arithmetic unit comprises:
    a NOR gate for performing NOR logic arithmetic after simultaneously receiving said input signal and said power-down signal; and
    an inverter for inverting a logic output from said NOR gate.

3. The input pad of claim 1 characterized in that during a power-down mode, said power-down signal is outputted in a logic "Low" state wherein said logic arithmetic unit comprises:
    a NAND gate for performing NAND logic arithmetic after simultaneously receiving said input signal and said power-down signal; and
    an inverter for inverting a logic output from said NAND gate.

4. An input pad for converting a dynamic input signal to a static input signal, in combination with a low-current-consuming integrated circuit, the combination comprising:
    an input terminal for receiving the dynamic input signal;
    an enable terminal for receiving a power-down signal;
    a logic arithmetic unit, incorporated into the input pad, for performing logic arithmetic after simultaneously receiving the dynamic input signal from said input terminal and the power-down signal from said enable terminal; and
    a function module for performing a corresponding function according to the logic arithmetic result output from the input pad.

5. The combination of claim 4 characterized in that during a power-down mode, said power-down signal is outputted in a logic "High" state wherein said logic arithmetic unit comprises:
    a NOR gate for performing NOR logic arithmetic after simultaneously receiving said input signal and said power-down signal; and
    an inverter for inverting a logic output from said NOR gate.

6. The combination of claim 4 characterized in that during a power-down mode, said power-down signal is outputted in a logic "Low" state wherein said logic arithmetic unit comprises:
    a NAND gate for performing NAND logic arithmetic after simultaneously receiving said input signal and said power-down signal; and
    an inverter for inverting a logic output from said NAND gate.

7. An input pad for use with an integrated circuit, the input pad comprising:
    a signal input terminal;
    an enable terminal; and
    a logic gate connected to receive an input signal via said signal input terminal and a power-down signal via said enable terminal, said logic gate producing a logical arithmetic output based on said input signal and said power-down signal.

8. The input pad of claim 7 characterized in that during a power-down mode, said power-down signal is outputted in a logic "High" state wherein said logic gate comprises:
    a NOR gate for performing NOR logic arithmetic after simultaneously receiving said input signal and said power-down signal; and
    an inverter for inverting a logic output from said NOR gate.

9. The input pad of claim 7 characterized in that during a power-down mode, said power-down signal is outputted in a logic "Low" state wherein said logic gate comprises:
    a NAND gate for performing NAND logic arithmetic after simultaneously receiving said input signal and said power-down signal; and
    an inverter for inverting a logic output from said NAND gate.

* * * * *